United States Patent Office 3,351,503

Patented Nov. 7, 1967

3,351,503

PRODUCTION OF P-N JUNCTIONS BY DIFFUSION

Richard A. Fotland, Lyndhurst, Ohio, assignor to Horizons Incorporated, a corporation of New Jersey No Drawing. Filed Sept. 10, 1965, Ser. No. 486,559
4 Claims. (Cl. 148—188)

ABSTRACT OF THE DISCLOSURE

This invention describes the production of P-N junctions on a semiconductor body by decomposing an adsorbed film of dopant, existing on the surface of the body, through the action of an electron beam.

This invention relates to the formation of P-N junctions. More particularly, it relates to the production of P-N junctions on a semiconductor body without recourse to any of the techniques heretofore used in such manufacture.

One presently known technique for fabricating discrete area P-N junctions on silicon or germanium involves a sequence of steps including covering the surface of a semiconductor chip with a photoresist, exposing the photoresist by contact printing through a lithographic type negative, processing the photoresist, treating the semiconductor surface to form a barrier layer (in the case of silicon this layer is generally silicon dioxide), removing the photoresist from the surface, and forming the junction by diffusion or epitaxial growth techniques well known to those versed in the art. This process is both time consuming and results in low yields because of the large number of processing steps involved.

The present invention overcomes the requirements for masks by defining the P-N junction area on a semiconductor slab simply by scanning an electron beam over the surface of the slab under suitable conditions. No art work or resists are required and the area on the surface of the semiconductor slab, which is converted to form a P-N junction, is defined by electrical deflection signals used to control the position of the electron beam. The electron beam scan may be readily controlled by computer, punch cards, magnetic tape and the like in order to generate complex patterns of P-N junctions on the semiconductor surface.

In accordance with the present invention, P-N junctions of definite configurations are produced on semiconductor base materials by utilizing an electron beam to decompose an adsorbed vapor of a compound of a desired dopant, and at the same time effect diffusion of the desired atoms into the semiconductor material.

A preferred procedure for forming a P-N junction at the surface of a silicon or germanium slab comprises the following sequence of steps:

Slicing the slab to the proper size;

Etching the surface to prepare a clean surface on the slab;

Mounting the clean slab in an evacuated chamber positioned so as to be at the focal plane of a low energy electron beam, then evacuating the vacuum chamber;

Introducing a dopant into the system at a pressure of between $10^{-4}$ and $10^{-3}$ torr;

Generating an electron beam using a conventional electron gun consisting of a cathode, accelerating electrodes, focusing electrodes or magnetic focusing coil and appropriate deflection coils;

Focusing the beam at the surface of the semiconductor slab; and

Scanning the area which is to be converted, thereby forming a P-N or N-P junction.

Preferred dopants include arsenic trichloride for the formation of P-type surface layers and boron trichloride for the preparation of N-type surface regions. Upon the introduction of either of these vapors into the system, a monolayer of dopant molecule is adsorbed at the surface of the semiconductor. If P-type silicon is employed as a slab, arsenic trichloride is introduced in order to convert the surface, upon electron beam irradiation, to N-type. Similarly, if N-type silicon is employed, boron trichloride vapor is introduced. The electron beam interacts with adsorbed molecules, decomposing the adsorbed molecule possibly by direct interaction of the electron beam with a dopant atom or as a result of the intense local heat generated instantaneously at the surface by the bombarding beam. This intense heat also provides the thermal activation energy for diffusing the dopant atom a short distance into the surface of a semiconductor.

In the practice of this invention, a slab of P-type silicon was mounted in a vacuum system and a small area on the surface scanned with a 500 volt electron beam at a beam current of 80 microamperes for a period of two hours. During this time, arsenic trichloride vapor was maintained in the chamber at a pressure of $4 \times 10^{-4}$ torr. The area irradiated by the electron beam was converted to a P-N junction. The converted surface was electroded with evaporated aluminum. The diode thus formed by the P-N junction was evaluated and it was found that the back-to-forward resistance ratio at 1 volt was slightly over 1000. The peak inverse voltage of this diode was 8 volts.

It is also possible to carry out the invention using a P-type dopant and an N-type base, for example with N-type silicon as the base and boron trichloride as the boron contributing dopant. Using the same operating conditions as in the preceding example diodes were formed having back-to-forward resistance ratios of about 800 and a peak inverse voltage breakdown of 7 volts.

This technique has the advantage of allowing P-N junctions to be formed at preselected discrete positions upon silicon or germanium slabs without resorting to the multiple steps involved in the conventional photoresist technique.

Although gas plating of metals at elevated temperatures and the electron beam decomposition of adsorbed compounds are well-known to those skilled in the art, the formation of P-N junctions, involving, as it does, the diffusion of impurities into a semiconductor lattice employing an electron beam is not obvious from the literature. In the electron beam formation of P-N junctions described herein, the electron beam serves to both decompose the adsorbed metal halide and to cause the metal atom to diffuse into the semiconductor structure.

A related invention is described in my copending application Serial No. 184,995 filed April 4, 1962, now abandoned.

Having now described preferred embodiments of the invention it is not intended that it be limited except as may be required by the appended claims.

I claim:

1. A method of producing P-N junctions which comprises: positioning a semiconductor material selected from the group consisting of P-type silicon and N-type silicon in an atmosphere of a decomposable vapor of a dopant compound at a pressure such that a layer of the vapor is adsorbed on the surface of the semiconductor material; decomposing selected portions of said adsorbed layer by scanning the same with an electron beam, thereby depositing a dopant on said semiconductor surface and diffusing the same into said semiconductor material, thereby producing a P-N junction in said semiconductor material.

2. The method of claim 1 wherein the dopant is arsenic trichloride when the semiconductor body is P-type silicon.

3. The method of claim 1 wherein the dopant is boron trichloride when the semiconductor body is N-type silicon.

4. The method of claim 1 wherein the pressure is between about $10^{-4}$ and $10^{-3}$ torr.

References Cited

UNITED STATES PATENTS

| | | | |
|---|---|---|---|
| 2,793,282 | 5/1957 | Steigerwald. | |
| 2,802,760 | 8/1957 | Derick | 148—189 |
| 3,095,332 | 6/1963 | Ligenza | 148—187 |
| 3,179,542 | 4/1965 | Quinn | 148—1.5 |
| 3,206,336 | 9/1965 | Hora | 148—1.5 X |

HYLAND BIZOT, *Primary Examiner.*